US012726180B2

(12) United States Patent
Yamada

(10) Patent No.: US 12,726,180 B2
(45) Date of Patent: Sep. 1, 2026

(54) FILTER CIRCUIT

(71) Applicant: ALPS ALPINE CO., LTD., Tokyo (JP)

(72) Inventor: Yukimitsu Yamada, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 1065 days.

(21) Appl. No.: 17/664,965

(22) Filed: May 25, 2022

(65) Prior Publication Data

US 2022/0294425 A1 Sep. 15, 2022

Related U.S. Application Data

(63) Continuation of application No. PCT/JP2020/042228, filed on Nov. 12, 2020.

(30) Foreign Application Priority Data

Dec. 4, 2019 (JP) ................................ 2019-219817

(51) Int. Cl.
*H03H 17/02* (2006.01)

(52) U.S. Cl.
CPC ............................... *H03H 17/0223* (2013.01)

(58) Field of Classification Search
CPC .... H03H 17/00; H03H 17/02; H03H 17/0223; H03H 21/0012; H03H 2017/009; G05B 2219/25243; G06F 7/02; G06F 17/15; G06F 3/16; G10H 2250/071; G10H 1/00; G10H 2250/121; G10L 15/02; G10L 21/0208;

(Continued)

(56) References Cited

U.S. PATENT DOCUMENTS

2003/0072398 A1* 4/2003 Abel .................. H03H 17/0261 375/350
2014/0307840 A1* 10/2014 Ng ....................... H04B 1/1027 375/350
2021/0083664 A1* 3/2021 Rouaissia ............... G06F 3/044

FOREIGN PATENT DOCUMENTS

JP H03-175497 7/1991
JP H07-030373 1/1995

(Continued)

OTHER PUBLICATIONS https://web.archive.org/web/20191026111055/https://en.wikipedia.org/wiki/Digital_filter (Year: 2019).*

(Continued)

*Primary Examiner* — Emily E Larocque
*Assistant Examiner* — Jerome Anthony Klosterman, II
(74) *Attorney, Agent, or Firm* — IPUSA, PLLC

(57) ABSTRACT

A filter circuit includes a processor configured to compare a current input value with a last-time output value, add a first correction value to the current input value and to the last-time output value if a comparison result between the current input value and the last-time output value is greater than a predetermined value, and add a second correction value smaller than the first correction value to the current input value and to the last-time output value if the comparison result is smaller than or equal to the predetermined value, and calculate a current output value based on the current input value and the last-time output value to each of which the first correction value or the second correction value has been added.

3 Claims, 7 Drawing Sheets

(58) Field of Classification Search
CPC .. G10L 27/78; H04H 40/72; G10K 11/17853; G10K 11/17854; G10K 11/17817
See application file for complete search history.

(56) References Cited

FOREIGN PATENT DOCUMENTS

| | | |
|---|---|---|
| JP | H09-322020 | 12/1997 |
| JP | 2003-271115 | 9/2003 |

OTHER PUBLICATIONS

International Search Report for PCT/JP2020/042228 mailed on Jan. 26, 2021.

* cited by examiner

FIG.3A

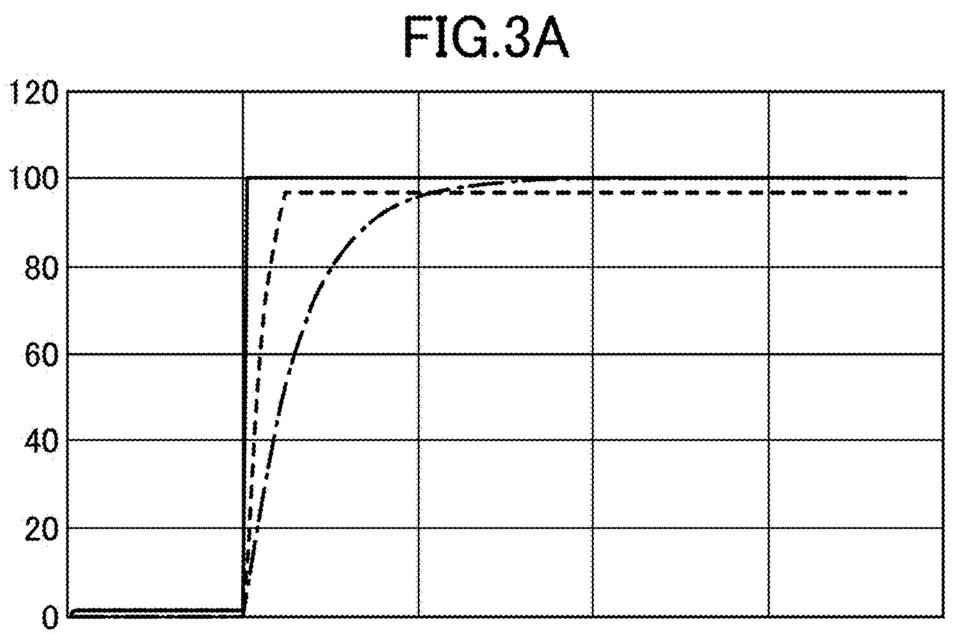

WAVEFORMS OF STEP INPUTS
RESPONSES OF THE OUTPUT VALUES OUTPUT OF THE LOW-PASS FILTERS
A RESPONSE OF AN OUTPUT VALUE OBTAINED FROM A LOW-PASS FILTER IN THE RELATED ART WITH MULTISTAGE BUFFERS

FIG.3B

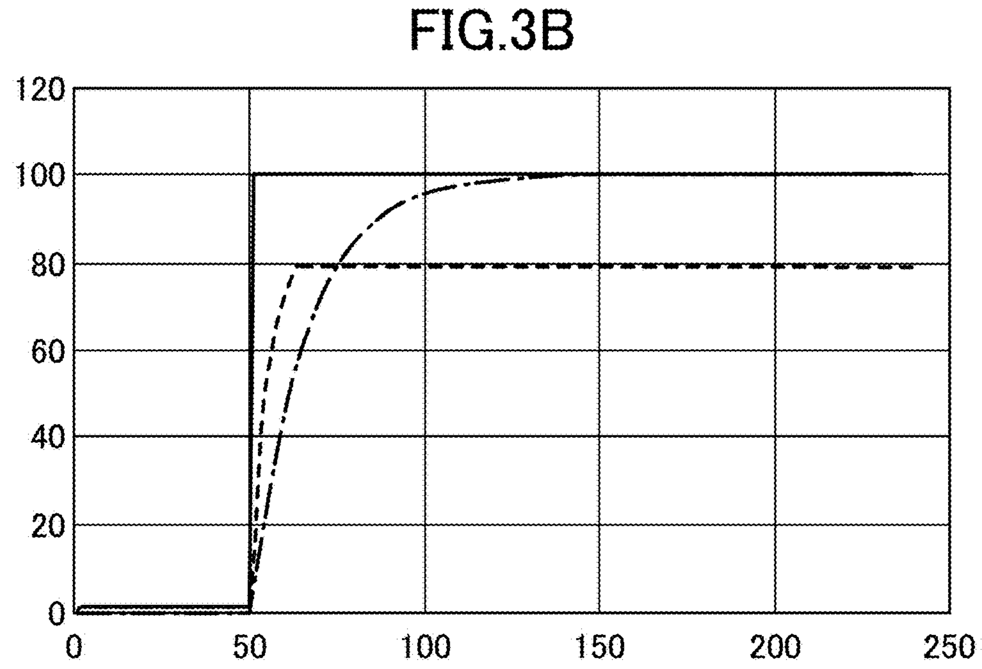

WAVEFORMS OF STEP INPUTS
RESPONSES OF THE OUTPUT VALUES OUTPUT OF THE LOW-PASS FILTERS
A RESPONSE OF AN OUTPUT VALUE OBTAINED FROM A LOW-PASS FILTER IN THE RELATED ART WITH MULTISTAGE BUFFERS

FILTER CIRCUIT

CROSS-REFERENCE TO RELATED APPLICATION

The present application is a continuation filed under 35 U.S.C. 111 (a) claiming the benefit under 35 U.S.C. 120 and 365 (c) of PCT International Application No. PCT/JP2020/042228 filed on Nov. 12, 2020, and designating the U.S., which is based on and claims priority to Japanese Patent Application No. 2019-219817, filed on Dec. 4, 2019. The entire contents of the PCT International Application No. PCT/JP2020/042228 and the Japanese Patent Application No. 2019-219817 are incorporated herein by reference.

BACKGROUND OF THE INVENTION

1. Field of the Invention

The present invention relates to a filter circuit.

2. Description of the Related Art

In the related art, there is provided a digital filter including a multiplying element. The digital filter includes a multiplying means multiplying a filter constant with respect to the multiplying element; an integrating means integrating a lower-order-byte value corresponding to a decimal part of a multiplication result of the multiplying means on a per multiplying operation basis; an overflow detecting means detecting that a value of a calculation result of the integrating means overflows to ±1 or more, outputting ±1 only when an overflow occurs, and outputting 0 in the other cases; and an adding means adding an output of the overflow detecting means to a higher-order-byte value corresponding to an integer part of the multiplication result (see, for example, Patent Document 1).

CITATION LIST

[Patent Document 1] Japanese Unexamined Patent Publication No. H07-030373

SUMMARY OF THE INVENTION

Technical Problem

For obtaining satisfactory attenuation characteristics with respect to a signal at a cut-off frequency, a required calculation amount of a digital filter increases.

In a digital filter in the related art, for obtaining satisfactory attenuation characteristics at a cut-off frequency, multiple stages of buffers to hold outputs of an adding means are required to adapt to the increase in the required calculating amount, resulting in an increase in the size of the memories (buffers).

Therefore, an object of the present invention is to provide a filter circuit capable of obtaining satisfactory attenuation characteristics while reducing the required calculation amount.

Solution to Problem

A filter circuit according to an embodiment of the present invention includes an input terminal to which a signal is input; an output terminal configured to output an output value in accordance with an input value of the signal; a memory configured to store an input value and an output value; and a processor configured to compare an input value and an output value, and correct an output value in accordance with an output of comparing. The processor is further configured to compare a current input value with a last-time output value, add a first correction value to the current input value and to the last-time output value if a comparison result between the current input value and the last-time output value is greater than a predetermined value, and add a second correction value smaller than the first correction value to the current input value and to the last-time output value if the comparison result is smaller than or equal to the predetermined value, and calculate a current output value based on the current input value and the last-time output value to each of which the first correction value or the second correction value has been added.

Advantageous Effects of the Invention

A filter circuit can be provided that provides satisfactory attenuation characteristics while reducing the required calculation amount.

BRIEF DESCRIPTION OF THE DRAWINGS

Other objects, features and advantages of the present invention will become more apparent from the following detailed description when read in conjunction with the accompanying drawings:

FIG. 3A is a diagram depicting a response of a low-pass filter.

FIG. 3B is a diagram depicting a response of a low-pass filter.

DETAILED DESCRIPTION OF THE PREFERRED EMBODIMENTS

Hereinafter, an embodiment using a filter circuit of the present invention will be described.

Embodiment

Figure 1:
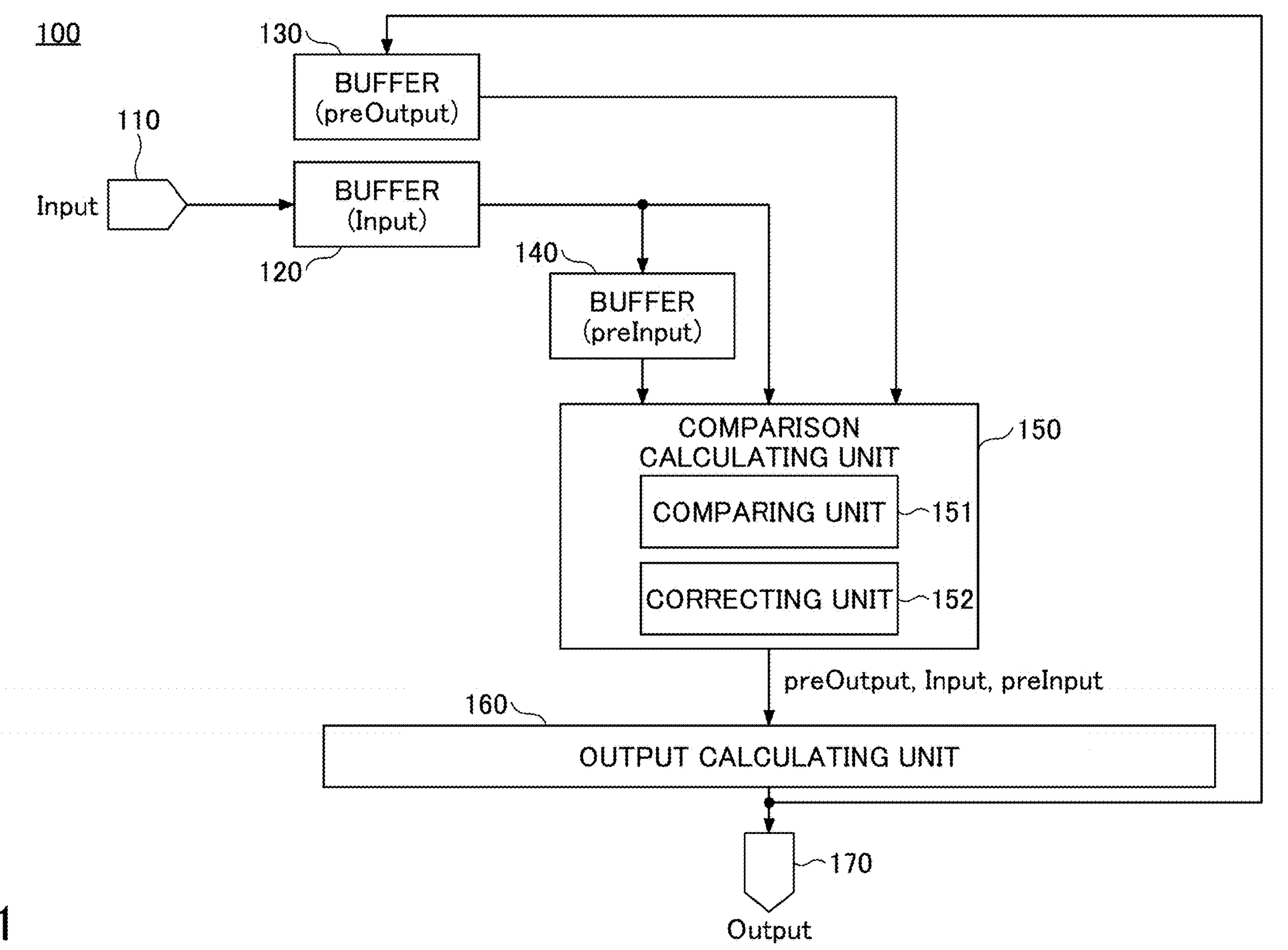
FIG. 1 is a diagram depicting a filter circuit 100 according to an embodiment.

FIG. 1 is a diagram depicting a filter circuit 100 of an embodiment. The filter circuit 100 includes an input unit 110, buffers 120, 130, and 140, a comparison calculating unit 150, an output calculating unit 160, and an output unit 170.

The filter circuit 100 is an example of a digital filter implemented by an 8-bit or 16-bit microcomputer. Hereinafter, a mode in which the filter circuit 100 is connected to a predetermined sensor and a signal detected by the sensor is input will be described. The signal detected by the sensor includes high-frequency noise.

The filter circuit 100 is a low-pass filter that cuts off frequency components of an input signal that are equal to or higher than a cutoff frequency and outputs only frequency components that are lower than the cutoff frequency.

The input unit 110 is connected to the filter circuit 100 and is an input terminal for inputting an input signal Input detected by the sensor. The input unit 110 is connected to an input terminal of the buffer 120 inside the filter circuit 100. The input unit 110 is an input terminal of a microcomputer that implements the filter circuit 100.

The buffer 120 includes an input terminal connected to the input unit 110 and an output terminal connected to the buffer 140 and the comparison calculating unit 150. The buffer 120 outputs an input signal Input from the input unit 110 to the buffer 140 and the comparison calculating unit 150.

The buffer 130 has an input terminal connected to the output calculating unit 160 and an output terminal connected to the comparison calculating unit 150. The buffer 130 holds an output value Output that is output from the output calculating unit 160, and outputs the output value Output as a last-time output value preOutput to the comparison calculating unit 150 in a next control cycle.

The buffer 140 has an input terminal connected to the buffer 120 and an output terminal connected to the comparison calculating unit 150. The buffer 140 holds an input signal Input that is input from the buffer 120, and outputs the input signal Input as a last-time input signal preInput in a next control cycle.

The comparison calculating unit 150 includes a comparing unit 151 and a correcting unit 152. The comparison calculating unit 150 has an input terminal connected to the buffers 120, 130, and 140 and an output terminal connected to the output calculating unit 160.

The comparing unit 151 compares an input signal Input from the buffer 120 with a last-time output value preOutput input from the buffer 130. The correcting unit 152 corrects an input signal Input that is input from the buffer 120, a last-time output value preOutput that is output from the buffer 130, and a last-time input signal preInput input from the buffer 140 in accordance with a comparison result of the comparing unit 151, and outputs thus corrected signals to the output calculating unit 160.

The output calculating unit 160 has an input terminal connected to the comparison calculating unit 150 and an output terminal connected to the output unit 170 and the buffer 130. The output calculating unit 160 outputs an output value Output obtained from a calculation of weighting with predetermined weights a corrected input signal Input, a last-time output value preOutput, and a last-time input signal preInput that are output from the comparison calculating unit 150, and summing up the thus weighted three signals.

The output calculating unit 160 calculates an output value Output by performing a weighting operation and a summing-up operation according to the following formula:

$$\text{Output}=\text{preOutput}/2+\text{preOutput}/4+\text{preOutput}/32+\text{preOutput}/16+\text{Input}/8+\text{preInput}/32$$

The output calculating unit 160 calculates an integer value rounded off to a decimal point for each term (preOutput/2, preOutput/4, preOutput/32, preOutput/16, Input/8, and preInput/32) on the right-hand side of the above-mentioned formula, and calculates the sum of the integer values of the respective terms. The weights applied to the six right-hand terms are ½, ¼, 1/32, 1/16, ⅛, and 1/32, respectively.

High-frequency noise has a large variation in signal level. In order to achieve a low-pass filter capable of removing high frequency noise, the output calculating unit 160 is configured in such a manner that the weight for a last-time output value preOutput is greater, the weight for an input signal Input is smaller, and the weight for a last-time input signal preInput is smaller.

The weight for a last-time output value preOutput is thus made greater to prevent an output value Output from changing significantly from a last-time output value preOutput. By setting the weight for a last-time input signal preInput as ⅛, an output is prevented from changing significantly from a last-time output value preOutput while a signal level of an input signal Input is added to the output value Output. By setting the weight for a last-time input signal preInput to be smaller than the weight for the input signal Input, an influence of adding a signal level of a last-time input signal preInput on an output value Output is minimized while the signal level of the last-time input signal preInput is added to the output value Output.

The output calculating unit 160 thus performs a weighting operation in the above-described manner to achieve the low-pass filter.

The output unit 170 outputs an output value Output of the output calculating unit 160. The output unit 170 is connected, for example, to a device or the like that utilizes a detection result of the predetermined sensor to which the filter circuit 100 is connected.

The filter circuit 100 performs, repeatedly at a predetermined control cycle, a process of outputting an output value Output obtained as a result of frequency components having the cutoff frequency or more of an input signal having been cut off.

Figure 2:
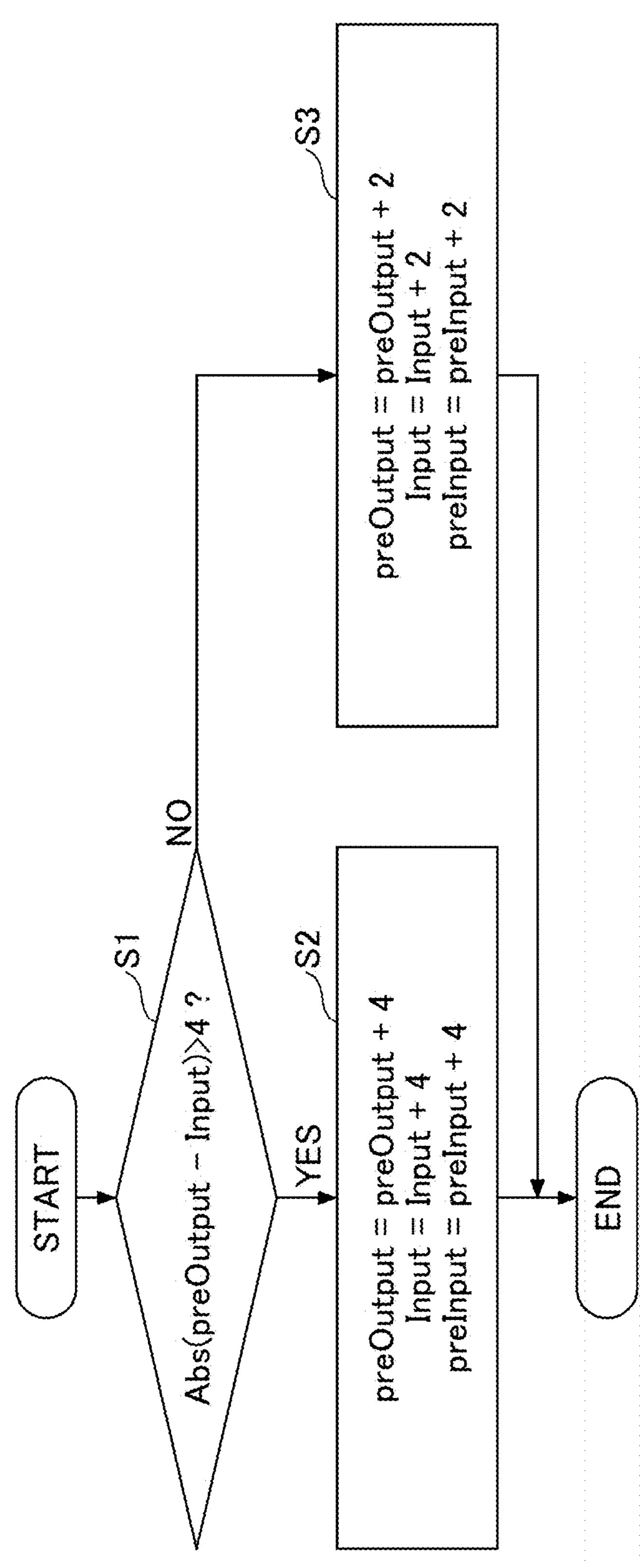
FIG. 2 is a flowchart depicting a process performed by a comparison calculating unit 150.

FIG. 2 is a flowchart depicting a process performed by the comparison calculating unit 150. The comparison calculating unit 150 repeatedly executes the process from the start to the end depicted in FIG. 2 at a predetermined control cycle.

In Step S1, the comparing unit 151 calculates an absolute value (Abs(preOutput-Input)) of a difference between an input signal Input that is input from the buffer 120 and a last-time output value preOutput that is input from the buffer 130, and determines whether the absolute value is 4 or more.

In Step S1, the comparing unit 151 compares the input signal Input from the buffer 120 with the last-time output value preOutput input from the buffer 130.

In response to the comparing unit 151 determining that the absolute value of the difference is 4 or more (S1: YES), the correcting unit 152 corrects the input signal Input, the last-time output value preOutput, and the last-time input signal preInput using a greater correction value (Step S2). Specifically, the correcting unit 152 performs correction of adding 4 to the input signal Input, to the last-time output value preOutput, and to the last-time input signal preInput.

In response to the comparing unit 151 determining that the absolute value of the difference is smaller than 4 (S1: NO), the correcting unit 152 corrects the input signal Input, the last-time output value preOutput, and the last-time input signal preInput using a smaller correction value (Step S3). Specifically, the correcting unit 152 performs correction of adding 2 to the input signal Input, to the last-time output value preOutput, and to the last-time input signal preInput.

A case where the absolute value of the difference obtained by the comparing unit 151 is 4 or more is a case where the difference between the input signal Input and the last-time output value preOutput is relatively great, and is a case where the input signal Input is relatively great with respect to the last-time output value preOutput.

When the output calculating unit 160 calculates an output value Output, a rounding error is generated through a rounding-off operation because each of weighted terms is round off to a decimal point. In order to reduce such a rounding error, the correcting unit 152 adds greater values to make it easier to be subject to a cutting-off operation when a change in an input signal Input is great, and adds a smaller value to make it difficult to be subject to a cutting-off operation when a change in an input signal Input is small.

The correction value used in Step S2 is not limited to 4, but should be greater than the correction value used in Step S3. The correction value used in Step S3 is not limited to 2, but should be smaller than the correction value used in Step S2.

FIGS. 3A and 3B are diagrams depicting responses of the low pass filter. FIG. 3A depicts a response (characteristics indicated by a broken line) of the filter circuit 100. FIG. 3B depicts a response (characteristics indicated by a broken line) of a low pass filter for comparison in which the comparison calculating unit 150 is removed from the filter circuit 100. In FIGS. 3A and 3B, a horizontal axis corresponds to time (milliseconds) and a vertical axis corresponds to a signal level (no unit).

In FIGS. 3A and 3B, solid lines indicate waveforms of step inputs, broken lines indicate responses of the output values Output of the low-pass filters, and alternate long and short dash lines indicate a response of an output value obtained from a low-pass filter in the related art with multistage buffers, taking into account also decimal places. The waveforms of solid-line step inputs and the waveforms of alternate-long-and-short-dash-line responses depicted in FIGS. 3A and 3B are the same between FIGS. 3A and 3B.

As depicted in FIG. 3A, in response to the waveform of the step input, the output value Output of the filter circuit 100 rises in about 10 ms, and a signal level of about 97 with respect to 100 of the input is obtained. Compared with the low-pass filter in the related art (alternate long and short dash line), it can be seen that the response is faster.

As depicted in FIG. 3B, the output value Output of a filter circuit for comparison in response to the waveform of the step input rises in about 15 ms, and a signal level of about 78 with respect to 100 of the input is obtained. It can be seen that although the response is faster than the low-pass filter in the related art (alternate long and short dash line), the response is slower and the signal level is smaller than those of the filter circuit 100.

Therefrom, it can be confirmed that the filter circuit 100 has a fast response and has satisfactory follow characteristics with respect to an input.

Figure 4:
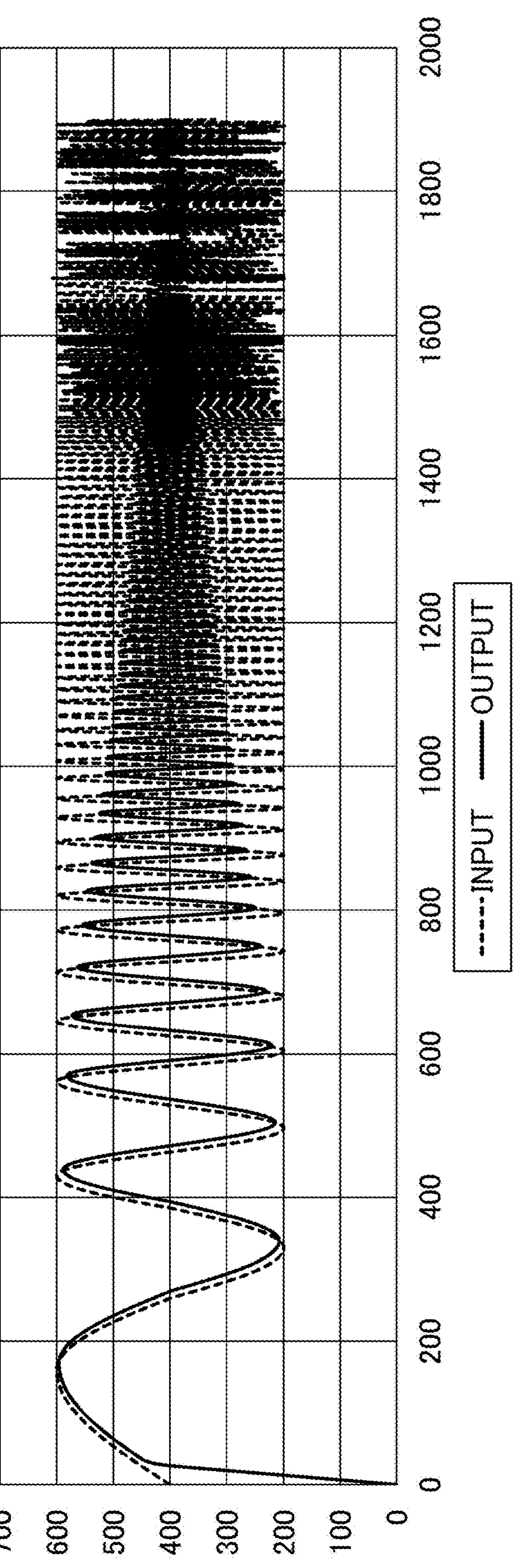
FIG. 4 is a diagram depicting frequency follow characteristics of the filter circuit 100.

FIG. 4 is a diagram depicting frequency follow characteristics of the filter circuit 100. The characteristics depicted in FIG. 4 are obtained through a simulation. In FIG. 4, the horizontal axis corresponds to time (milliseconds (ms)) and the vertical axis corresponds to a signal level (no unit). The characteristics indicated by the dark line are characteristics of an input signal, and the characteristics indicated by the light line are characteristics of an output value Output. In FIG. 4, the frequency of the input signal is gradually increased over time, and specifically, the frequency of the input signal is increased continuously from 10 Hz to 10 kHz.

The output value Output is about slightly smaller (smaller in amplitude) than the signal level of the input signal when the frequency of the input signal is low, whereas, when the frequency of the input signal is high, the amplitude attenuates to about 1/10. It can be also seen that the output value Output smoothly follows the frequency increase.

It can be seen that the attenuation rate thus increases on the high-frequency side, indicating that the low-pass filter capable of removing high-frequency noise is obtained.

Figure 5A:
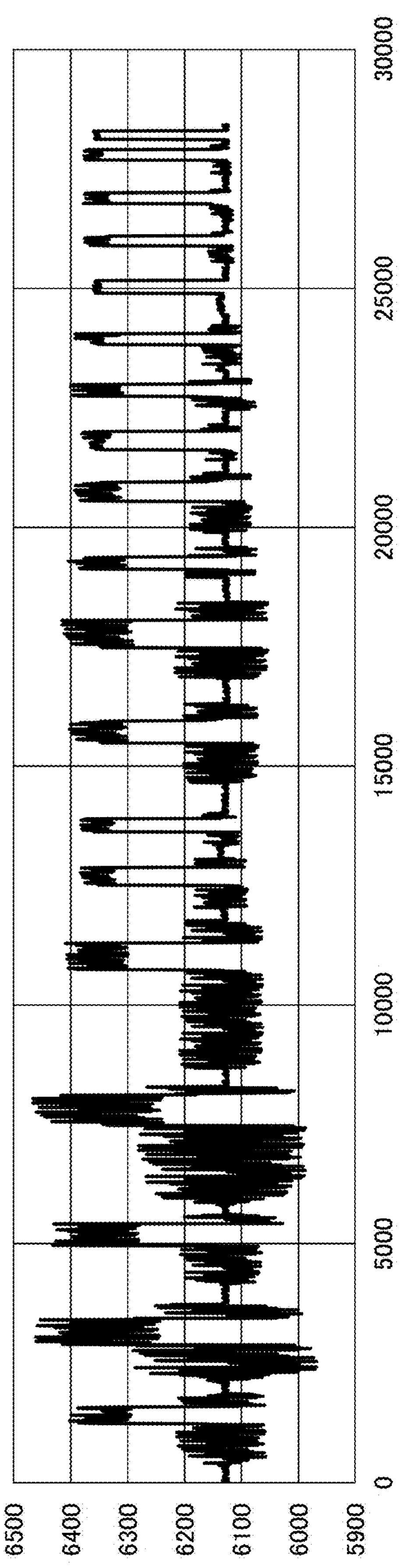
FIG. 5A is a diagram depicting the characteristics of an input signal.
Figure 5B:
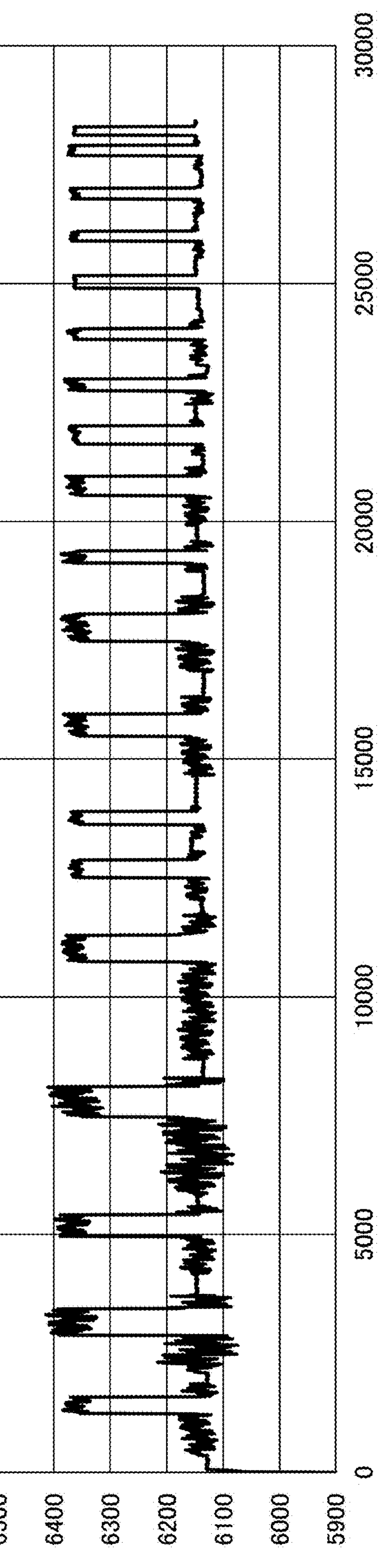
FIG. 5B is a diagram depicting the characteristics of an output value the filter circuit 100.
Figure 5C:
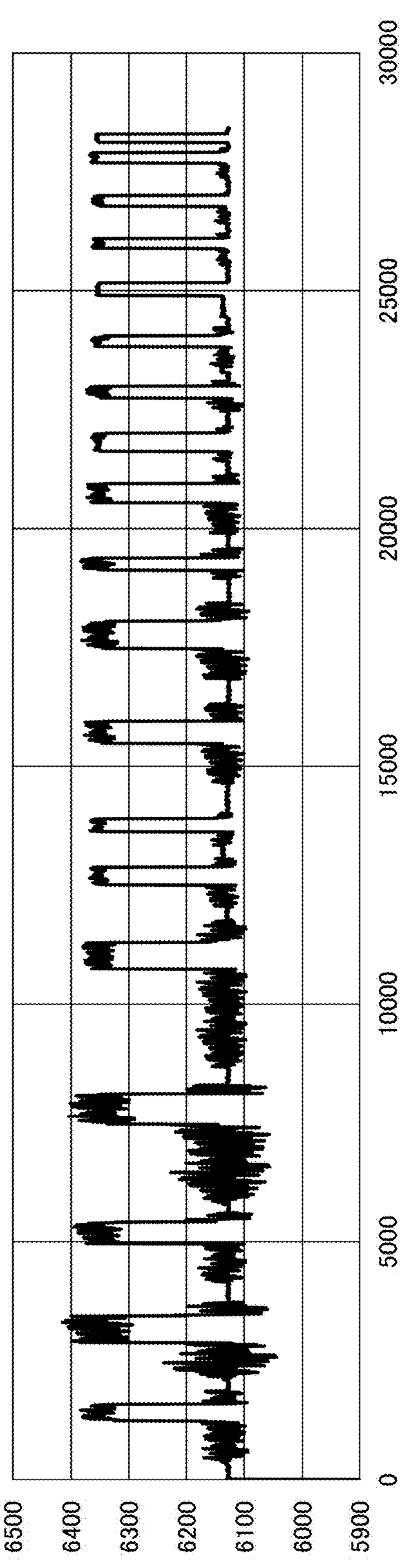
FIG. 5C is a diagram depicting the characteristics of an output value obtained by taking into account decimal places of a low-pass filter in the related art including 8 buffers having a multiple-stage configuration.

FIGS. 5B-5C are diagrams depicting output waveforms of the low-pass filter. The characteristics depicted in FIGS. 5A-5C are those obtained from an experiment. In each of FIGS. 5A-5C, the horizontal axis corresponds to time (milliseconds) and the vertical axis corresponds to a signal level (no unit).

In FIGS. 5A-5C, the characteristics indicated by the darkest line indicate an input signal Input; the characteristics indicated by the medium tone line indicate an output value Output of the filter circuit 100, and the characteristics indicated by the lightest line indicate an output value obtained by taking into account decimal places of a low-pass filter in the related art including 8 buffers having a multiple-stage configuration.

In FIGS. 5A-5C, as in FIG. 4, the frequency of the input signal is gradually increased over time, and, specifically, is increased continuously from 10 Hz to 10 KHz.

It can be seen that with respect to the input signal Input, the outputs of the filter circuit 100 and the low-pass filter in the related art attenuate, and the output value Output of the filter circuit 100 attenuates more (to have a smaller amplitude) than the output value of the low-pass filter in the related art.

Thus, the filter circuit 100 has a fast response and has a higher attenuation rate than the low-pass filter in the related art having multiple-stage buffers. In the filter circuit 100, the number of buffers (120, 130, and 140) is three, and an output value Output can be obtained only by calculating a difference in the comparing unit 151 of the comparison calculating unit 150, adding a correction value in the correcting unit 152, and calculating a weighted sum in the output calculating unit 160.

Therefore, it is possible to provide the filter circuit 100 which has satisfactory attenuation characteristics while reducing the required calculation amount. The filter circuit 100 can be implemented by a microcomputer on the order of 8 bits or 16 bits.

It should be noted that although the configuration of the filter circuit 100 including the buffer 140 has been described above, the buffer 140 need not be included in the filter circuit 100. In this case, an output of the output calculating unit 160 does not include a corrected last-time input signal preInput, and the output calculating unit 160 calculates an output value Output without using the last-time input signal preInput.

Although the filter circuits have been described with reference to the embodiments, the present invention is not limited to these embodiments, and various modifications or variations can be made within the scope of the present invention.

What is claimed is:

1. A filter circuit comprising:

an input terminal to which a signal including noise components that are equal to or higher than a cutoff frequency is input;

an output terminal configured to output an output value in accordance with an input value of the signal;

a processor;

one or more memories configured to store an input value and an output value, and instructions to cause the processor to:

compare an input value and an output value, and correct an output value in accordance with an output of comparing, wherein the instructions further cause the processor to compare a current input value with a last-time output value, add a first correction value to the current input value and to the last-time output value if a comparison result between the current input value and the last-time output value is greater than a predetermined value, and add a second correction value smaller than the first correction value to the current input value and to the last-time output value if the comparison result is smaller than or equal to the predetermined value, said comparison result being defined as an absolute value of a difference between the current input value and the last-time output value, said second correction value being smaller than the first correction value when a result of subtracting the second correction value to the first correction value is larger than 0, calculate a current output value based on the current input value and the last-time output value to each of which the first correction value or the second correction value has been added, and output the current output value, thereby removing the noise components, wherein the one or more memories are further configured to store a last-time input value, and the instructions further cause the processor to calculate the current output value based on the current input value and the last-time output value to each of which the first correction value or the second correction value has been added and based on the last-time input value stored in the memory, and wherein the instructions further cause the processor to calculate the current output value using a first buffer for storing the input value, a second buffer for storing the last-time output value, and a third buffer for storing the last-time input value, thereby improving a signal attenuation rate in a predetermined frequency range and reducing a computational load without using multi-stage buffers.

2. The filter circuit as claimed in claim 1, wherein the instructions further cause the processor to, when calculating the output value, use a weight applied to the last-time output value greater than a weight applied to the current input value.

3. The filter circuit as claimed in claim 1 wherein the instructions further cause the processor to, when calculating the output value, use a weight applied to the last-time output value greater than a weight applied to the current input value.

* * * * *